United States Patent
Chua

(10) Patent No.: US 8,748,919 B2
(45) Date of Patent: Jun. 10, 2014

(54) ULTRAVIOLET LIGHT EMITTING DEVICE INCORPORATING OPTICALLY ABSORBING LAYERS

(75) Inventor: Christopher L. Chua, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 343 days.

(21) Appl. No.: 13/096,988

(22) Filed: Apr. 28, 2011

(65) Prior Publication Data

US 2013/0099141 A1   Apr. 25, 2013

(51) Int. Cl.
*H01L 29/72* (2006.01)

(52) U.S. Cl.
USPC ............. 257/94; 257/13; 257/76; 250/504 R

(58) Field of Classification Search
USPC ................. 257/13, 76, 94; 250/504 R
See application file for complete search history.

(56) References Cited

U.S. PATENT DOCUMENTS

| | | | |
|---|---|---|---|
| 6,724,013 B2 * | 4/2004 | Kneissl et al. | ........... 257/79 |
| 7,067,838 B1 | 6/2006 | Sato et al. | |
| 7,856,040 B2 | 12/2010 | Bour et al. | |

OTHER PUBLICATIONS

Crawford et al., "Advances in AlGaN-Based Deep UV LEDs", Mater. Res. Soc. Symp. Proc., vol. 831, 2005, 12 pages.
Kneissl et al., "Advances in group III-nitride-based deep UV light-emitting diode technology", Semicond. Sci. Technol. 26, 2011, 6 pages.
Shatalov et al., "Reliability of AlGaN-based deep UV LEDs on sapphire", Proc. of SPIE, vol. 6134, 2006, 10 pages.
Xin et al., "Electrical and Optical Characteristics of Delta Doped AlGaN Cladding Layer Materials for Highly Efficient 340nm Ultra Violet LEDs", Mater. Res. Soc. Symp. Proc., vol. 798, 6 pages.

* cited by examiner

*Primary Examiner* — Edward Wojciechowicz
(74) *Attorney, Agent, or Firm* — Hollingsworth Davis, LLC

(57) ABSTRACT

A light emitting device includes a p-side, an n-side, and an active layer between the p-side and the n-side. The p-side includes a p-side contact, an electron blocking layer, a p-side separate confinement heterostructure (p-SCH), and a p-cladding/current spreading region disposed between the p-SCH and the p-side contact. The n-side includes an n-side contact, and an n-side separate confinement heterostructure (n-SCH). The active layer is configured to emit light in a wavelength range, wherein the p-side and the n-side have asymmetrical optical transmission properties with respect to the wavelength range emitted by the active layer.

18 Claims, 10 Drawing Sheets

| Layer | Repetition | Comments |
|---|---|---|
| 20 nm GaN:Mg, 0.2 nm/sec | | p-contact layer |
| 3.49 nm Al$_{35}$Ga$_{65}$N:Mg, 0.218 nm/sec<br>3.85 nm Al$_{30}$Ga$_{70}$N:Mg, 0.191 nm/sec | 21 X | 153.51 nm p-type superlattice<br>Al = 0.32 |
| 65.52 nm Al$_{33}$Ga$_{67}$N:Mg, 0.0546 nm/sec | | p-SCH |
| 40 nm Al$_{65}$Ga$_{32}$N:Mg, 0.1081 nm/sec | | electronic blocking |
| 50.63 nm Al$_{44}$Ga$_{56}$N:Si, 0.0293 nm/sec | | DH active λg = 298.8 nm |
| 38.64 nm Al$_{53}$Ga$_{47}$N:Si, 0.0322 nm/sec | | n-SCH |
| 5.35 nm Al$_{50}$Ga$_{50}$N:Si, 0.2674 nm/sec<br>4.22 nm Al$_{55}$Ga$_{45}$N:Si, 0.2639 nm/sec | 68 X | 652.08 nm n-type superlattice<br>Al=0.522 |
| 1.32 nm Al$_{55}$Ga$_{45}$N:Si, 0.0322 nm/sec | | |
| 900 nm Al$_{54}$Ga$_{45}$N:Si, 0.1667 nm/sec | | n-contact |
| 100 nm Al$_{54}$Ga$_{45}$N:Si, 0.1667 nm/sec | | Interface to low Al |
| 0.25 nm GaN, 0.05 nm/sec<br>.038 nm AlN, 0.032 nm/sec | 41 X | 75.83 nm dual period short period superlattice defect reduction layer |
| 0.25 nm GaN, 0.05 nm/sec<br>1 nm AlN, 0.032 nm/sec | 40 X | |
| 28.8 nm AlN, 0.032 nm/sec | | surface conditioning layer |
| 1080 nm AlN template | | substrate |
| sapphire | | |

FIG. 7

ULTRAVIOLET LIGHT EMITTING DEVICE INCORPORATING OPTICALLY ABSORBING LAYERS

STATEMENT REGARDING FEDERALLY SPONSORED RESEARCH AND DEVELOPMENT

This invention was made with Government support under W911NF-08-2-0031 awarded by the U.S. Army. The Government has certain rights in this invention.

SUMMARY

Various embodiments described herein involve light emitting devices that include an active layer configured to emit light having a wavelength range, a p-contact, a p-cladding/current spreading region disposed between the active layer and the p-contact, and a p-side separate confinement heterostructure (p-SCH) disposed between the active layer and the p-cladding/current spreading region. The p-SCH is substantially optically absorbing at the wavelength range emitted by the active layer.

In some implementations, a light emitting diode includes an active layer comprising $Al_xGa_{1-x}N$, a p-contact, a p-cladding/current spreading region disposed between the p-contact and the active layer, and a p-side separate confinement heterostructure (p-SCH) comprising $Al_yGa_{1-y}N$ disposed between the active layer and the p-cladding/current spreading region. The p-SCH has a lower Al content than an Al content of the active layer. The turn on voltage or operating voltage of the diode is less than a substantially similar light emitting diode except that a p-SCH of the substantially similar diode has an Al content that is greater than or equal to an Al content of an active layer.

In some embodiments, a light emitting device includes a p-side, an n-side and an active layer between the p-side and the n-side. The p-side includes a p-side contact, an electron blocking layer, a p-side separate confinement heterostructure (p-SCH), and a p-cladding/current spreading region disposed between the p-SCH and the p-side contact. The n-side includes an n-side contact, and an n-side separate confinement heterostructure (n-SCH). The active layer is configured to emit light in a wavelength range, wherein the p-side and the n-side have asymmetrical optical transmission properties with respect to the wavelength range emitted by the active layer.

Some approaches involve a method that includes generating light having a peak wavelength of less than 300 nm in an active layer of a light emitting device. The light is emitted toward a p-side of the device and toward an n-side of the device. A majority of the light emitted toward the p-side is absorbed in the p-side of the device. A majority of the light emitted toward the n-side is transmitted through the n-side of the device.

Some embodiments involve a method of making a light emitting device. The method includes forming a n-side separate confinement heterostructure (n-SCH), forming a light emitting active region, the active region comprising $Al_xGa_{1-x}N$, forming a p-cladding/current spreading region adjacent a p-contact of the device, and forming a p-side separate confinement heterostructure (p-SCH) comprising $Al_yGa_{1-y}N$, disposed between the active region and the p-cladding/current spreading region, wherein x>y.

The above summary is not intended to describe each embodiment or every implementation. A more complete understanding will become apparent and appreciated by referring to the following detailed description and claims in conjunction with the accompanying drawings.

BRIEF DESCRIPTION OF THE DRAWINGS

FIG. 7 is a diagram showing composition, layer thickness, and growth rate for the layers of a light emitting device that includes an optically absorbing p-SCH in accordance with some embodiments;

DESCRIPTION OF VARIOUS EMBODIMENTS

Figure 1:
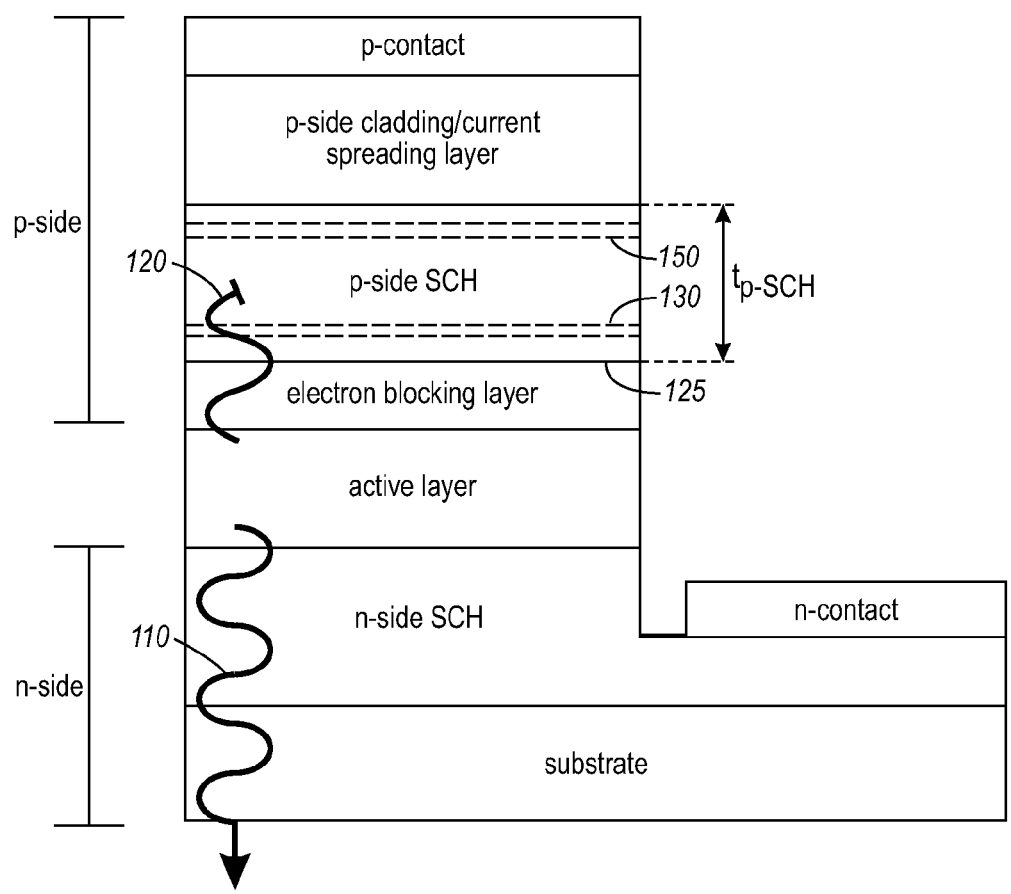
FIGS. 1 and 2 are schematic diagrams of light emitting devices that may be configured to use optically absorbing layers in a separate confinement heterostructure (SCH) of the device.

Ultraviolet light emitting devices (UV LEDs) operating below 300 nm can potentially be used in a number of applications, including water purification, disinfection, UV curing, phototherapy, and medical diagnostics. Light emitting devices that emit the in the 295 to 275 nm range have been fabricated based on AlGaN alloys and InAlGaN alloys with aluminum concentrations in the range of about 47-60%. However, these wide bandgap materials present a number of fabrication challenges that can reduce LED performance. For example, the high Al content of these devices can lead to low carrier mobility, particularly in the p-side layers of the device. Low carrier mobility leads to an increase in device resistance and high turn-on and operating voltages, resulting in significant device heating.

A UV LED structure includes an active region disposed between n-side and p-side confinement regions. The n- and p-side confinement regions are configured to contain the carriers within the active region. The n- and p-side confinement regions are referred to herein as n-separate confinement heterostructure (n-SCH) and p-separate confinement heterostructure (p-SCH), respectively, although in some cases one or both of these regions may not be configured as a heterostructure and/or may comprise only a single layer.

In some implementations, light generated by the active region emerges from the p-side of the device after traveling through the p-SCH and/or emerges from the n-side of the device after traveling through the n-SCH. Sometimes a reflector is used to direct the emitted light so that light emerges from only one side of the device. For example, a reflector may be used at the p-side of the device to direct the light toward the n-side.

The active region of an light emitting device can include multiple layers, at least one of which is a light emitting layer. For example, in some cases, the active region of an light emitting device may comprise a double heterostructure (DH) having one or more light emitting layers. As another example, the active region of an light emitting device may comprise a quantum well structure that includes one or more quantum wells separated by barrier layers. In such a device, the quantum wells are the active light emitting layers and the barrier layers are non-light emitting. As referred to herein, the term "active layer" is used to identify one or more light emitting layers of an active region.

For UV LEDs operating below about 300 nm, AlGaN or InAlGaN can be used as the material of the active layer as well as for the n- and p-SCH layers. The bandgap of the active layer, and thus the wavelength of the emitted light, depends on the Al content of the AlGaN or InAlGaN. Higher Al content in the active layer produces shorter wavelength light. The n-SCH and p-SCH regions can be made to be optically transmissive to light emitted from the active layer if the bandgap of the n-SCH and p-SCH exceeds the bandgap of the active layer. The wider bandgap that provides optically transmissive materials requires significant Al content, i.e., an Al content greater than that of the active layer. The high Al content presents fabrication difficulties, particularly in the p-SCH, because high Al content decreases the carrier mobility in these layers. The hole mobility in the p-SCH can be particularly low in high Al content AlGaN or InAlGaN, which leads to increased device resistance and device heating.

Embodiments described in this disclosure involve the use of SCHs e.g., on the p-side of the light emitting device, that have a lower bandgap than the bandgap of the active layer, making these layers optically absorbing to the light emitted by the active layer. The SCHs described herein, with reference to the AlGaN system, have a lower Al concentration than the Al concentration of the active layer. The lower Al content, particularly in the p-SCH increases carrier mobility and current spreading, thereby reducing the device resistance and the turn on and operating voltages of the device. Even though a portion of the light emitted from the active layer is absorbed in the SCHs of the devices described herein, the tradeoff with respect improved conductivity, lower turn on and operating voltages, and other device parameters provides enhanced device characteristics. Although the examples provided use AlGaN structures, other materials, e.g., InAlGaN, may alternatively or additionally be used.

FIG. 1 illustrates a schematic cross section of an LED that can incorporate an SCH that is optically absorbing at the wavelengths emitted by the active layer. The LED illustrated in FIG. 1 is formed on a substrate and may include a series of surface conditioning and/or defect reduction layers disposed on the substrate to facilitate fabrication of the device. The active light emitting layer is disposed between p-side and n-side SCHs. An electron blocking layer can be used between the active layer and the p-SCH to assist in containing electrons within the active region. The active layer may be configured, for example, as multiple quantum wells or as a double heterostructure. A p-cladding/current spreading layer, which may comprise multiple layers, is arranged between the p-SCH and the p-contact. The p-cladding/current spreading layer is configured to assist the p-SCH and electron blocking layer to contain carriers within the active region and/or to assist in spreading current throughout the device. The composition of these layers is also selected to facilitate fabrication of the device. For example, the composition of the p-SCH and/or p-cladding/current spreading layer may be selected to reduce lattice strain and/or reduce device cracking During operation, bias voltage is applied to the device through the n- and p-contacts. In the example illustrated in FIG. 1, the device does not include a reflector. If a reflector is used, it could be arranged between the p-cladding/current spreading layer and the p-contact, or the p-contact may serve as a reflector, for example.

According to some embodiments, the p-SCH comprises material having a bandgap that is less than the bandgap of the active layer and the n-SCH material has a bandgap that is greater than or equal to the bandgap of the active layer. Thus, the p-SCH is optically absorbing and the n-SCH is optically transmissive at the wavelength of light emitted by the active layer. If AlGaN and/or InAlGaN materials are used for layers of the device, the bandgaps of the AlGaN and/or InAlGaN layers can be controlled by the Al concentration of the layers. To achieve a lower bandgap in the p-SCH layer relative to the bandgap of the active layer, then the p-SCH has an Al content less than the Al content of the active layer. To achieve a higher or equal bandgap in the n-SCH layer relative to the bandgap of the active layer, the n-SCH has an Al content greater than or equal to the Al content of the active layer.

As illustrated in FIG. 1, when the p-SCH is optically absorbing and the n-SCH is optically transmissive, light 110 generated by the active layer and emitted toward the n-side of the device travels through the optically transmissive n-SCH and through the substrate to emerge from the n-side of the LED. Light 120 generated by the active layer and emitted toward the p-side of the diode travels into the p-SCH where it is absorbed and does not emerge from the device. Thus, in the case of roughly equal amounts of light emitted toward the n-side and p-side of the device, potentially about 50% of the light generated by the active layer can be lost through absorption in the p-SCH.

In some implementations, a substantial amount, e.g., greater than about 25%, of the material of the p-SCH layer has a bandgap less than the bandgap of the active layer. In some cases, a majority, e.g., greater than 50%, of the material of the p-SCH layer has a bandgap less than the bandgap of the active layer. In some cases, more than about 75% or even more than about 85% of the material of the p-SCH layer has a bandgap less than the bandgap of the active layer. When the active layer and p-SCH comprise AlGaN or InAlGaN materials, more than 25%, 50%, 75% or even 85% of the AlGaN of the p-SCH may have an Al content less than the Al content of the active layer.

In some optically absorbing p-SCHs, the bandgap of the material of the p-SCH is less than the bandgap of the active layer. For some AlGaN and/or InAlGaN systems that include optically absorbing p-SCHs, the Al content of the active layer is greater than the Al content of the p-SCH. In these cases, a substantial amount, e.g., more than 25% of the light emitted toward the p-side of the device may be absorbed in the p-SCH. In some cases, a majority of the light emitted toward to the p-side, e.g., over 50% or over 75%, or over 85% may be absorbed in the p-SCH.

In some cases, the p-SCH can include one or more regions or layers near the active layer with a bandgap lower than the bandgap of the active layer. In some cases, the p-SCH may additionally or alternatively include one or more regions or layers nearer the p-contact, or on the opposite side of the p-SCH from the active layer, with a bandgap lower than the bandgap of the active layer. As previously discussed, for the AlGaN or InAlGaN material systems, a lower Al content produces a lower bandgap, thus the lower bandgap regions would have a lower Al content.

For example, with reference to FIG. 1, the p-SCH may include a region or layer 130 having an Al concentration that is less than the Al concentration of the active layer at a location in the p-SCH that is closer to the active layer. The region closer to the active layer may be positioned at a location less about 25% or less than about 50% of the thickness, $t_{p\text{-}SCH}$ of the p-SCH as measured from the surface 125 of the p-SCH closest to the active layer. Alternatively or additionally, the p-SCH may include a region or layer 150 having an Al concentration that is less than the Al concentration of the active layer at a location in the p-SCH that is closer to the p-contact. The region closer to the p-contact maybe positioned at a location more than about 50% or more than about 75% of the thickness, $t_{p\text{-}SCH}$, of the p-SCH as measured from the surface 125 of the p-SCH closest to the active layer.

Embodiments described in this disclosure involve light emitting devices that have asymmetrical p-SCH and n-SCH layers. In some cases, the asymmetry of the device may relate to the optical, compositional, or physical properties of the device, wherein the line of symmetry corresponds to the active layer. For example, the optical transmission/absorption properties of the device may be asymmetrical because the n-SCH is less optically absorbing than the p-SCH. For example, the n-SCH may be substantially optically transmissive and the p-SCH is substantially optically absorbing. Such a device would also be asymmetrical with regard to the bandgap of the p-SCH and n-SCH layers. For AlGaN or InAlGaN systems, a device may have compositional asymmetry because the Al content of the n-SCH is greater than the Al content of the p-SCH. In some cases, the optically absorbing layers absorb more than 50% of the light at the wavelengths of interest and the optically transmissive layers transmit more than 50% of the light at the wavelengths of interest.

Figure 2:
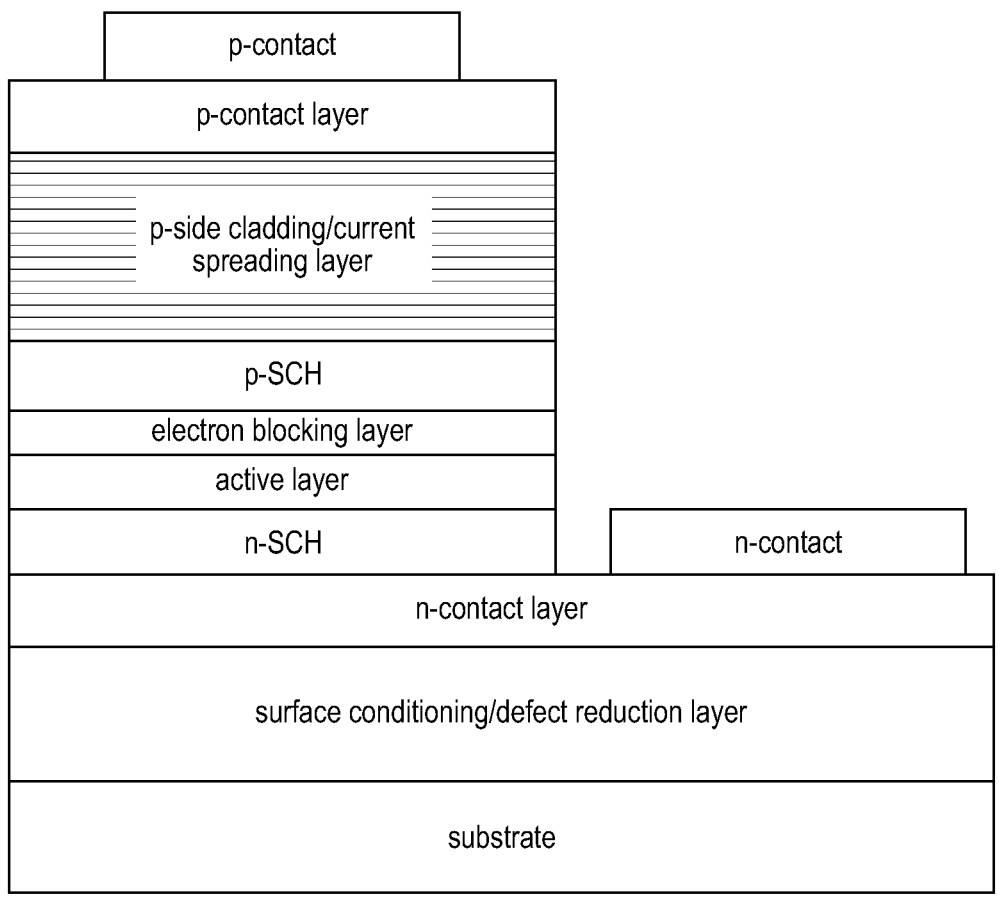

In some cases, as illustrated by the LED of FIG. 2, the p-side of the device may include a p-SCH and a p-side cladding/current spreading region comprising a superlattice of alternating layers of AlGaN (or InAlGaN) which can differ in thickness and/or Al content. The Al concentration of the p-SCH is selected to be lower than the Al concentration of the active layer, making the p-SCH optically absorbing, but also enhancing the conductivity and/or other electrical properties of the p-SCH. Lowering the Al content of the p-SCH reduces its effectiveness as a confinement structure, thus the Al content of the electron blocking layer may be increased to compensate for the reduction of effectiveness of the p-SCH. Lowering the Al content of the p-SCH can degrade fabrication because low Al content can cause the device to crack. The amount of Al may be selected to be sufficiently low to provide enhancement of carrier mobility, device operating voltages and/or other device properties, but not so low as to result in device cracking A p-contact layer, e.g., comprising GaN, may be disposed between the p-cladding/current spreading layer and the p-contact.

On the n-side, the device may also incorporate a surface conditioning layer, such as AN on a sapphire substrate, an n-SCH, and a superlattice disposed between the substrate and the n-SCH. The n-side superlattice may comprise alternating layers of GaN/AlN to reduce lattice strain in the device.

Figure 3:
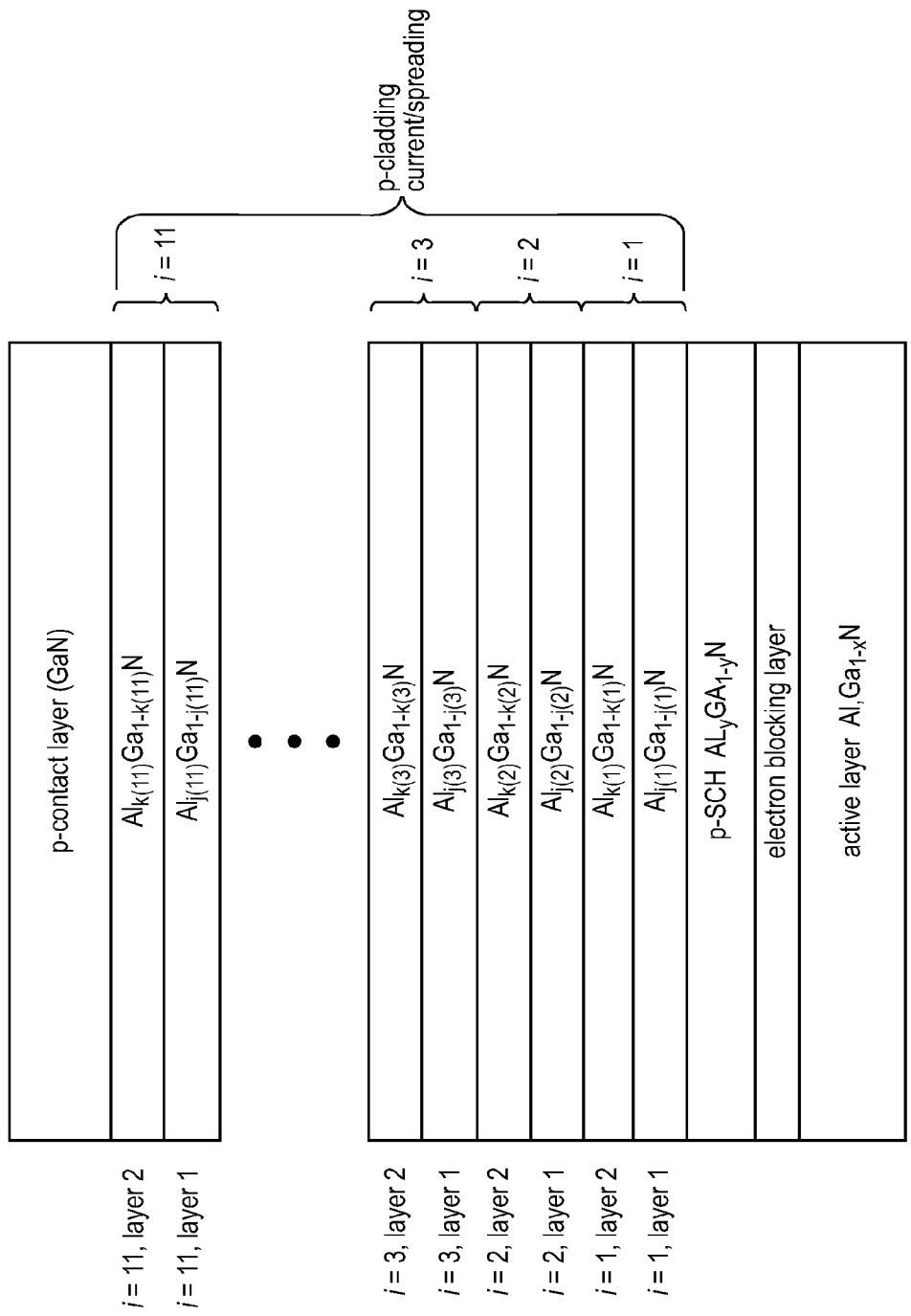
FIG. 3 is a diagram that illustrates a portion of a light emitting device including the active region and p-side of the device, the p-side including a p-SCH and a superlattice having layer pairs of $Al_jG_{1-j}N/Al_kGa_{1-k}N$ wherein one or both of j and k can change as a function of the position of the layer pair in the superlattice in accordance with some embodiments.

FIG. 3 is a more detailed diagram of a portion of the device illustrated in FIG. 2. In this example, the device is based on the AlGaN material system. The portion of the LED depicted in FIG. 4 includes an active layer comprising $Al_xGa_{1-x}N$, an electron blocking layer, a p-SCH comprising $Al_yGa_{1-y}N$, a p-cladding/current spreading superlattice, and a p-contact layer which comprises GaN in this example. The subscript x indicates the concentration of Al in the active layer and the subscript y indicates the concentration of Al in the p-SCH. For example, for an LED emitting wavelengths in the range of about 295 to 275 nm, the Al concentration of the active layer is between about 47-60%, corresponding to x=0.47 to 0.60. The Al concentration of the p-SCH is less than the Al concentration of the active layer, i.e., x>y.

As shown in FIG. 3, the p-cladding/current spreading superlattice may include alternating layer pairs of AlGaN. The superlattice allows for various Al content profiles for the p-cladding/current spreading region which can facilitate fabrication of the device. The layer pairs in the superlattice are denoted $Al_{j(i)}Ga_{1-j(i)}N/Al_{k(i)}Ga_{1-k(i)}N$, where i indicates the position of the layer pair in the superlattice, and j and k indicate the concentration of Al in the first and second layers, respectively, of the superlattice layer pairs. The layer pair closest to the active layer is designated as the first layer pair, i=1, the second layer pair is designated i=2, and so on until reaching the last layer pair in the superlattice, i=11 in this example, which is closest the p-contact layer. In this example, there are 11 layer pairs, although more or fewer layer pairs may be used in other configurations.

The relative concentration of Al in the active layer and the p-cladding/current spreading layer may have x>j and x>k for all values of i. In some configurations, x>j and k=0 for all values of i and in other configurations, x<j and/or k for some values of i and x>j and/or k for other values of i. Many additional combinations of x, j, and k may be used to produce p-cladding/spreading layer.

Each of the first and second layers in the layer pairs i=1, 2, 3, . . . 11 have a thickness that can vary according to the position of the layer pairs in the superlattice. For example, the thickness of the first layers in the layer pairs may be represented as $t_1(i)$ and the thickness of the second layers in the layer pairs may be designated $t_2(i)$, where i again indicates position in the superlattice. In various configurations, one or both of the thickness and the Al concentration of the superlattice layers may vary as a function of position in the superlattice. In these cases, the average Al concentration of each layer pair may be calculated as $(t_1(i)j(i)+t_2(i)k(i))/t_1(i)+t_2(i)$.

Figure 4:
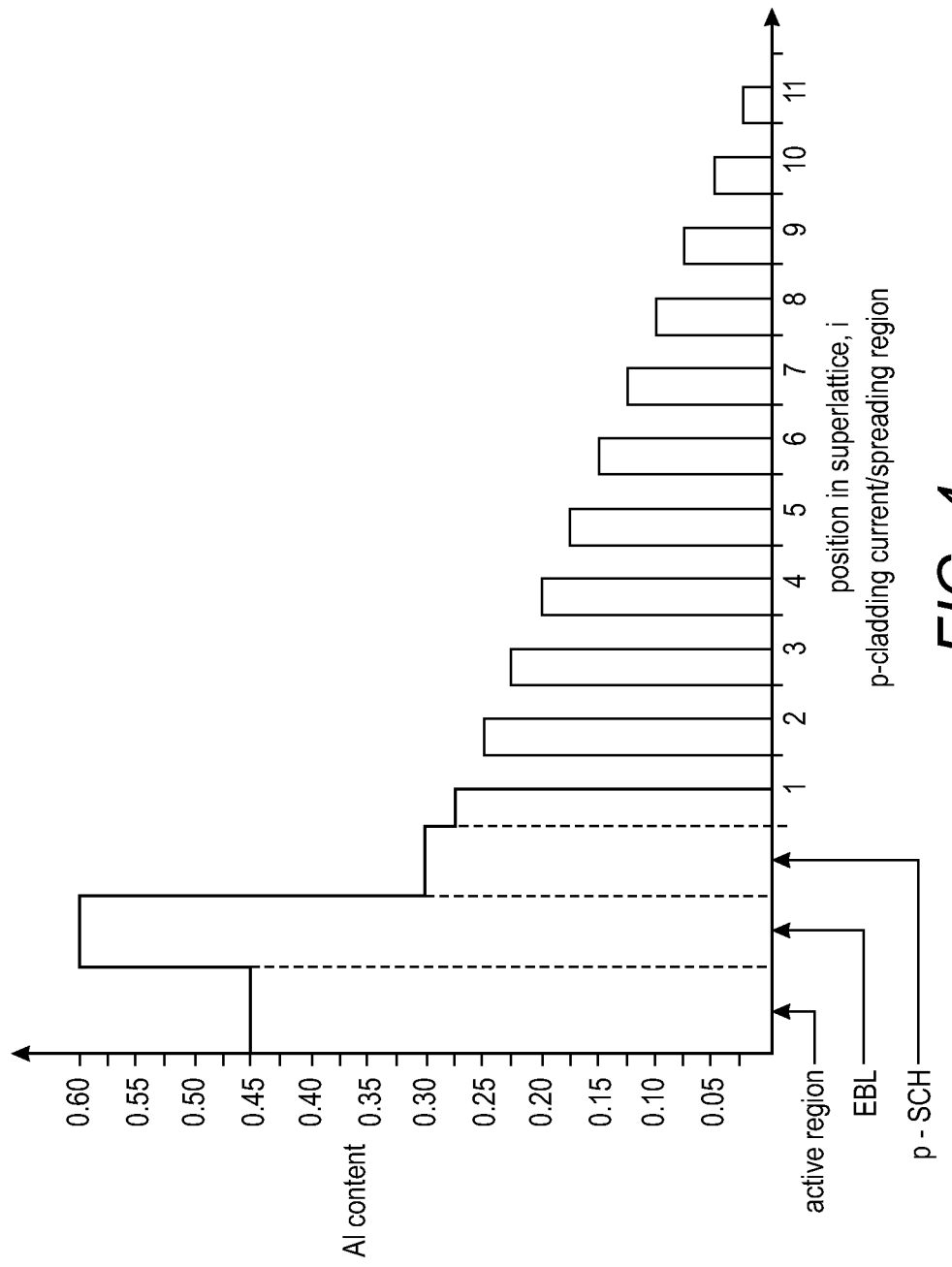
FIG. 4 illustrates an Al profile of a portion of a light emitting device including the active region, p-SCH, and p-cladding/current spreading superlattice, the superlattice including step decreases of Al content as a function of position of the layer in the superlattice in accordance with some embodiments.

FIG. 4 graphically illustrates an Al concentration profile for the p-side of the LED shown in FIG. 3 according to an exemplary implementation. In this example, the Al concentration of the active layer corresponds to x=0.45. The electron blocking layer (EBL) has an Al concentration of 0.60. The Al concentration of the p-SCH in this example corresponds to y=0.30, making the p-SCH optically absorbing to light emitted from the active layer. The thickness of the first and second layers of each of the layer pairs of the p-cladding/current spreading superlattice remains substantially the same while the Al concentration of the first layers in the layer pairs decreases with position. The Al concentration of each of the second layers of the layer pairs has zero Al content, corresponding to k=0. In other words, the second layer of each layer pair is made of GaN. Other values for k could alternatively be chosen and/or k could vary with position in the lattice. The Al concentration of the first layer of each of the layer pairs 1-11 decreases in 11 steps from j=0.275 in the first layer of layer pair i=1 to j=0.025 in the first layer of layer pair i=11.

Figure 5:
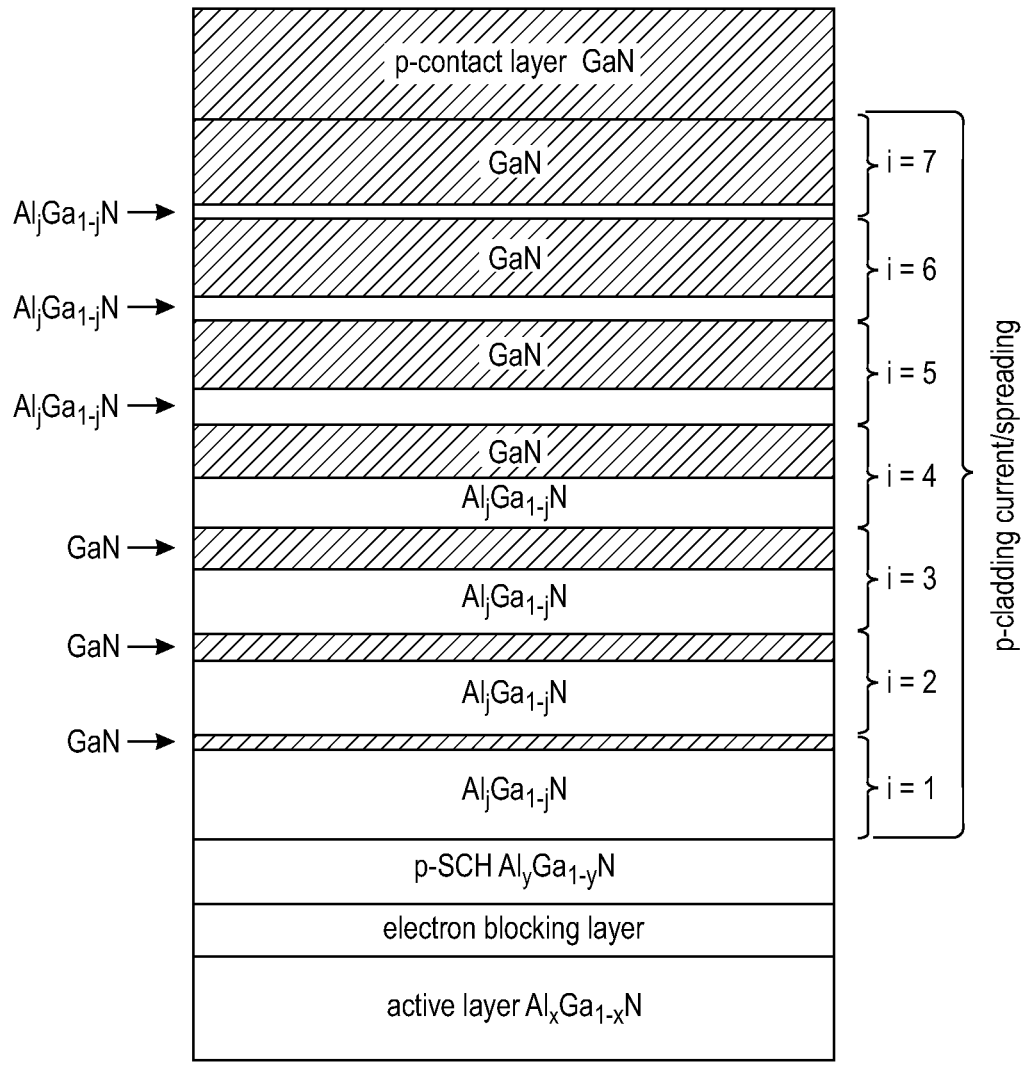
FIG. 5 illustrates a portion of a light emitting device including an active region, p-SCH, and p-cladding/current spreading superlattice, the superlattice having layer pairs including a first layer of $Al_jGa_{1-j}N$ and a second layer of GaN, wherein the thickness of the $Al_jGa_{1-j}N$ and GaN layers changes as a function of layer pair position in the superlattice in accordance with some embodiments.

FIG. 5 shows a portion of light emitting device including an $Al_xGa_{1-x}N$ active layer, an electron blocking layer, an $Al_yGa_{1-y}N$ p-SCH, and a p-cladding/current spreading region that includes a $Al_jGa_{1-j}N/GaN$ superlattice with 7 layer pairs corresponding to i=1 through 7. In this example, the Al concentration of the p-SCH is lower than the Al concentration of the active layer, i.e., x>y. The Al concentration of the first and second layers of each layer pair of the p-cladding/current spreading superlattice remains substantially the same regardless of position in the superlattice. The Al concentration of each of the first layer pairs is j, wherein j could be greater than or less than y. The Al concentration of the second layer pairs is less than y. In this example, j=0.50, and the Al concentration of the second layer pairs is zero, i.e., the second layer pairs are GaN. The thickness of the first and second layers of the layer pairs changes as a function of position in the superlattice. The thickness of the $Al_jGa_{1-j}N$ layers decreases and the thickness of the GaN layers increases with distance from the active layer. The thickest GaN layer is disposed next to the p-contact layer which is also a GaN layer.

Figure 6:
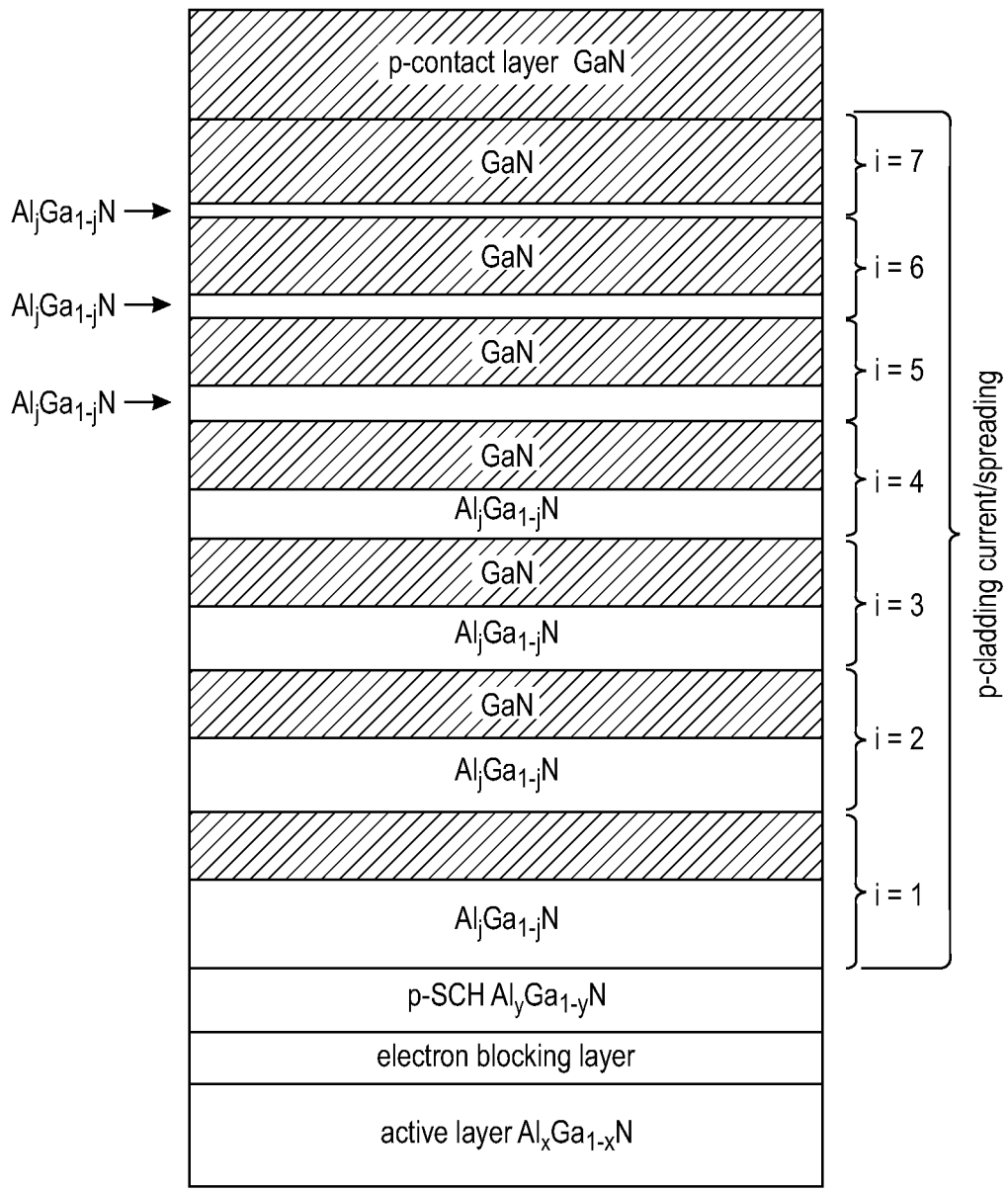
FIG. 6 illustrates a portion of a light emitting device including an active region, p-SCH, and p-cladding/current spreading superlattice, the superlattice having layer pairs including a first layer of $Al_jGa_{1-j}N$ and a second layer of GaN, wherein the thickness of the $Al_jGa_{1-j}N$ layers changes as a function of layer pair position in the superlattice in accordance with some embodiments.

In some implementations, the GaN layers in an $Al_jGa_{1-j}N/GaN$ superlattice may have the same thickness in each layer pair and the $Al_jGa_{1-j}N$ layers decrease with position in the superlattice, as depicted in FIG. 6. FIG. 6 shows a portion of a light emitting device including an $Al_xGa_{1-x}N$ active layer, an electron blocking layer, and a $Al_yGa_{1-y}N$ p-SCH, wherein x>y. A p-cladding/current spreading region includes an $Al_jGa_{1-j}N/GaN$ superlattice with 7 layer pairs corresponding to i=1 through 7. In this example, the GaN layers have the same thickness in each layer pair and the $Al_jGa_{1-j}N$ layer decreases in thickness with distance from the active layer.

EXAMPLES

Light emitting diodes having active areas of 100 μm×100 μm and 300 μm×300 μm were fabricated using the structure and growth conditions indicated in FIG. 7. Each of the sample devices were epitaxially grown on sapphire substrates using a metal organic chemical vapor deposition (MOCVD) process. A 1080 nm AlN template was initially grown on the substrate followed by a 28.8 nm surface conditioning layer grown at a rate of 0.032 nm/sec. A 75.83 nm dual period short period superlattice was grown as a defect reduction layer. The dual period superlattice included a first superlattice comprising 40 alternating layers of 1 nm AlN and 0.25 nm GaN. The AlN layers were grown at a rate of 0.032 nm/sec and the GaN layers were grown at a rate of 0.05 nm/sec. The second superlattice in the defect reduction layer included 41 alternating layers of 0.38 nm AlN grown at a rate of 0.032 nm/sec and 0.25 nm GaN, grown at a rate of 0.05 nm/sec. A 100 nm Si doped $Al_{0.54}Ga_{0.48}$N layer grown at a rate of 0.1667 nm/sec was used as an interface to the n-contact. The n-contact was 900 nm Si doped $Al_{0.54}Ga_{0.48}$N grown at 0.1667 nm/sec.

A 68 layer superlattice was formed with an initial 1.32 nm layer of Si doped $Al_{0.50}Ga_{0.50}N$ grown at a rate of 0.2639 nm/sec followed by alternating layers of 4.33 nm Si doped $Al_{0.55}Ga_{0.45}N$ and 5.35 nm $Al_{0.50}Ga_{0.50}N$. The $Al_{0.55}Ga_{0.45}N$ layers were grown at a rate of 0.2639 nm/sec and the $Al_{0.50}Ga_{0.50}N$ layers were grown at a rate of 0.2674 nm/sec.

The total thickness of the n-side superlattice was 652.08 nm and the average Al concentration was 0.522.

The n-SCH is a 38.64 nm layer of $Al_{0.53}Ga_{0.46}N$ doped with Si and grown at a rate of 0.0322 nm/sec.

The active regions of the sample diodes included a double heterostructure comprising a 50.63 nm layer of Si doped Al0.44Ga0.56N grown at a rate of 0.0293 nm/sec. The active layer emitted light having a wavelength λg=2.98.8 nm. An electron blocking layer was used between the p-side SCH and the active region to block electrons from exiting the active region. The electron blocking layer was Mg doped $Al_{0.68}Ga_{0.32}N$ layer grown at a rate of 0.1081 nm/sec to a thickness of 40 nm.

The p-SCH layer was formed of a 65.52 nm layer of Mg doped $Al_{0.33}Ga_{0.67}N$ grown at a rate of 0.0546 nm/sec. The p-SCH was followed by a p-cladding/current spreading structure comprising a superlattice including 21 layer pairs including 3.82 nm Mg doped $Al_{0.30}Ga_{0.70}N$ first layers grown at a rate of 0.191 nm/sec and 3.49 nm Mg doped $Al_{0.35}Ga_{0.65}N$ second layers grown at a rate of 0.218 nm/sec. The 21 layer pair superlattice had a total thickness of 153.51 nm and average Al concentration of 0.32. Disposed on the p-side superlattice was a 20 nm Mg doped GaN p-contact layer grown at 0.2 nm/sec.

Figure 8:
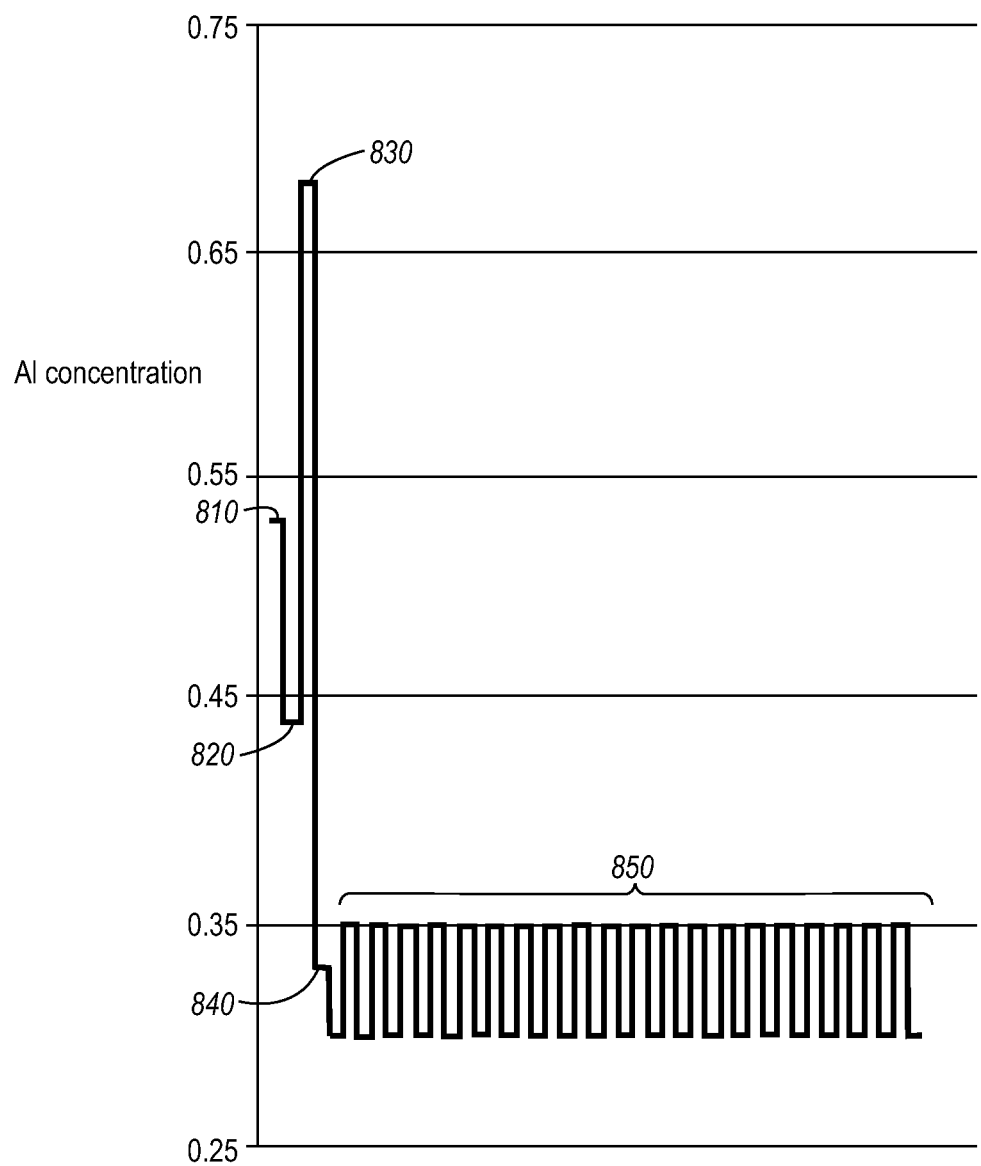
FIG. 8 is a graph illustrating the Al concentration profile of the device of FIG. 7.

FIG. 8 shows the Al concentration profile of the structure of FIG. 7 including the Al concentrations of the n-SCH 810, active layer 820, electron blocking layer 830, p-SCH 840 and p-cladding/current spreading layers 850 of the structure of FIG. 7. The Al concentration of the alternating layers of the superlattice result in the alternating Al concentration in the profile 850 of the p-cladding/current spreading region.

Figure 9:
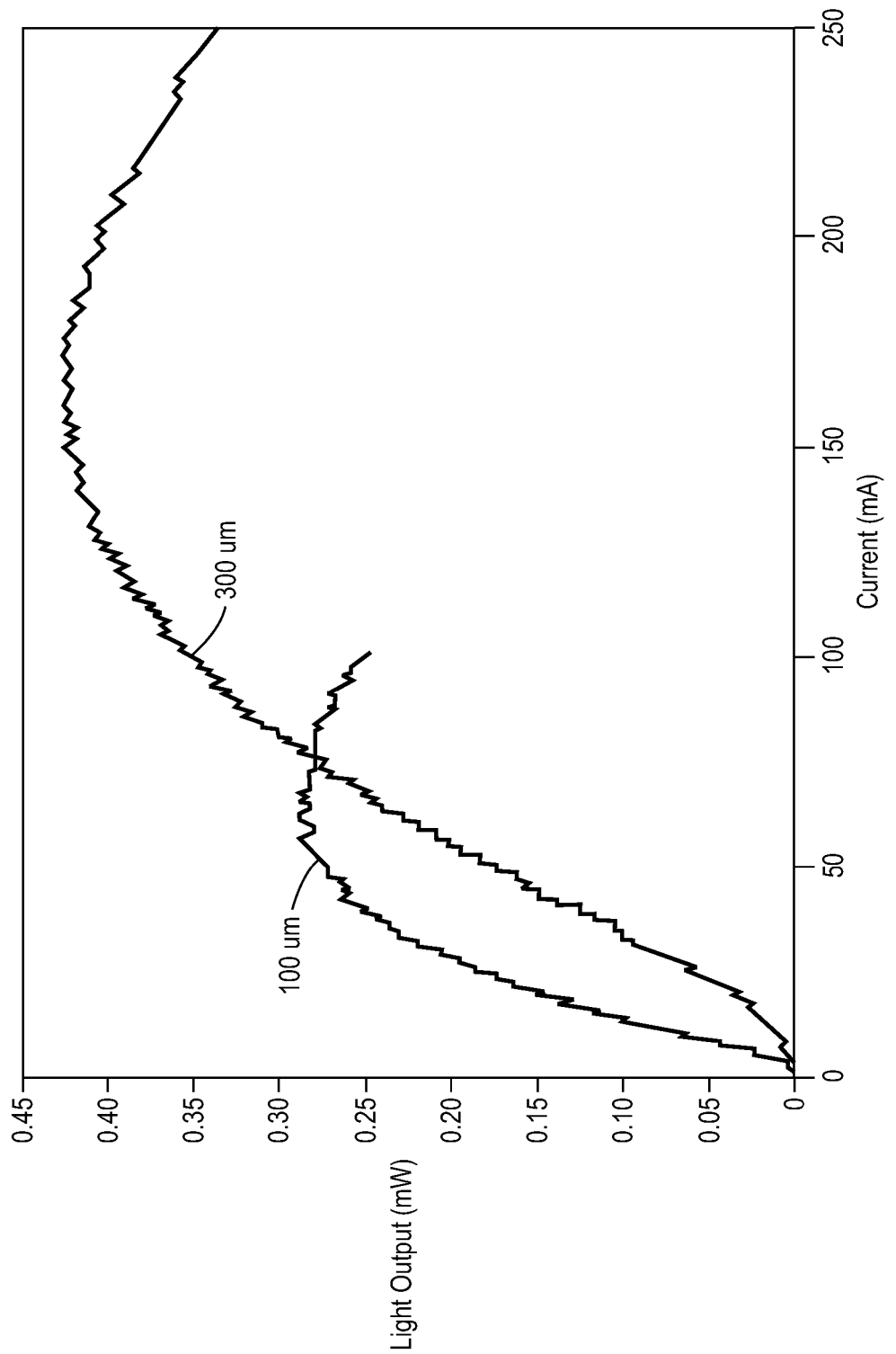
FIG. 9 graphically illustrates light output as a function of current for a 300 μm×300 μm sample light emitting device and a 100 μm×100 μm sample light emitting device in accordance with some embodiments.

FIG. 9 shows the light output in mW as a function of current for the 100 μm×100 μm and 300 μm×300 μm devices that were fabricated having a structure illustrated by FIGS. 7 and 8. The light output by the 100 μm×100 μm and 300 μm×300 μm test devices is greater than or equal to light output from a device having a substantially similar construction to the test devices except that the similarly constructed device has a higher Al concentration, optically transmissive p-SCH rather than the optically absorbing p-SCH as in the test devices.

Figure 10:
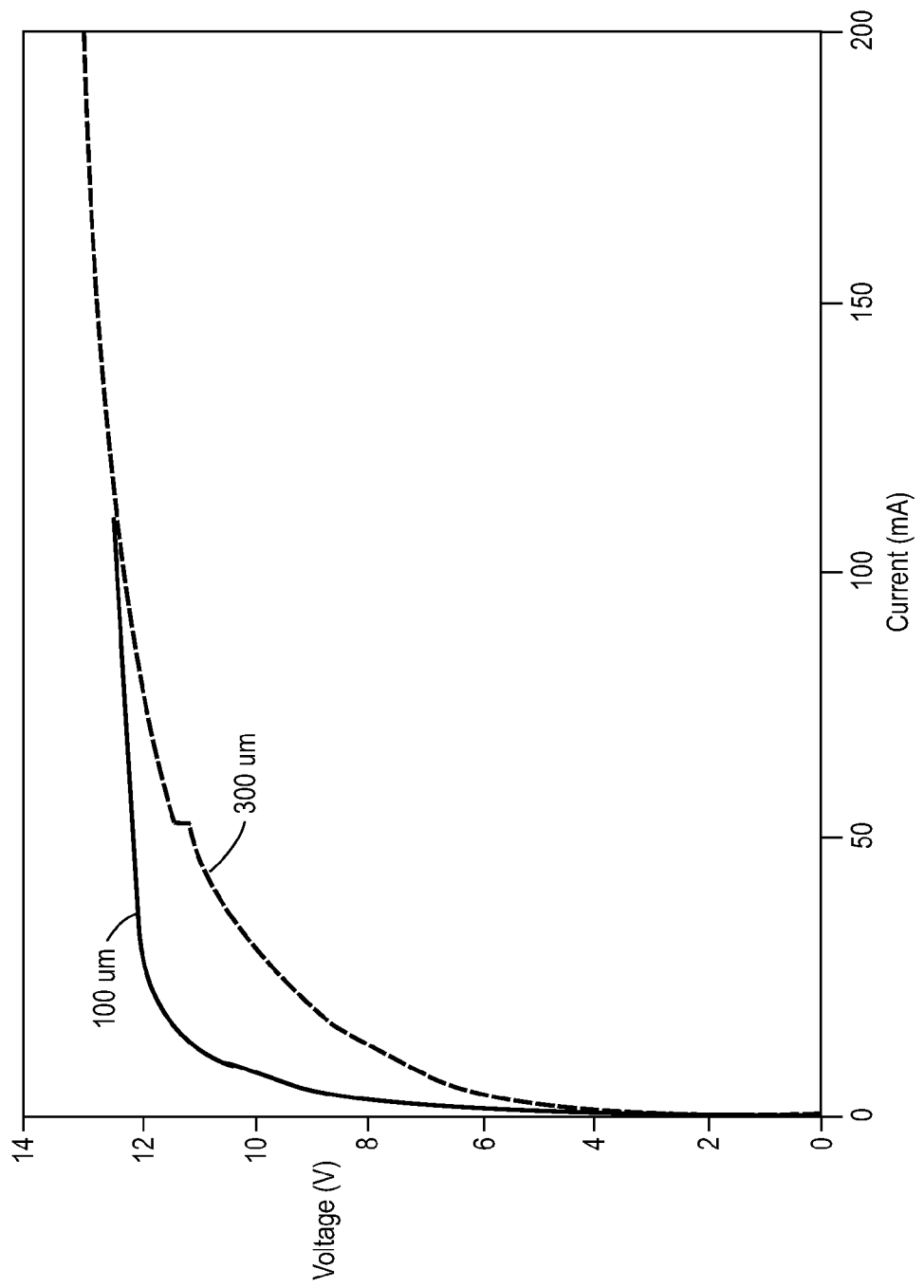
FIG. 10 graphically illustrates I-V characteristics of the 300 μm×300 μm sample light emitting device and the 100 μm×100 μm sample light emitting device.

FIG. 10 shows the current-voltage (IV) characteristics of the 100 μm×100 μm and 300 μm×300 μm devices. The devices exhibit a turn on voltage of about 7 volts and an operating voltage of about 12 V. The turn on and operating voltages of the test devices is less than the turn on and operating voltages of a device having a substantially similar construction to the test devices except that the substantially similar device has a higher Al concentration, optically transmissive p-SCH rather than the optically absorbing p-SCH as in the test devices.

Embodiments disclosed herein involve UV LEDs that have optically absorbing layers. Exemplary materials for these UV LEDs are AlGaN and InAlGaN. High operating voltages in UV LEDs can arise due to high concentration of Al in the AlGaN or InAlGaN p-SCH. Using an Al content in the LED structures that is lower than the Al content of the active layer, e.g., using the lower Al content in the p-SCH layers, makes these layers optically absorbing but enhances other device characteristics. The use of an optically absorbing p-SCH recognizes that the top p-contact layer is GaN, which is also optically absorbing at wavelengths less than about 365 nm. Therefore, in devices operating below 365 nm, the optical loss caused by lower Al content and lower bandgap p-SCH layers is relatively small. There is little penalty for lowering the Al content of the p-SCH to beyond the optically absorbing limit because a portion of the light directed toward the p-SCH layers would be absorbed regardless of the material used for the p-SCH layers. Lowering the Al content of the p-SCH layer may provide enhanced current spreading, lower device operating voltages, and reduced heating, for example.

Systems, devices or methods disclosed herein may include one or more of the features, structures, methods, or combinations thereof described herein. For example, a device or method may be implemented to include one or more of the features and/or processes described herein. It is intended that such device or method need not include all of the features and/or processes described herein, but may be implemented to include selected features and/or processes that provide useful structures and/or functionality.

In the following detailed description, numeric values and ranges are provided for various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims. The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A light emitting device, comprising:
   an active layer configured to emit light having a wavelength range;
   a p-contact;
   a p-cladding/current spreading region disposed between the active layer and the p-contact; and
   a p-side separate confinement heterostructure (p-SCH) disposed between the active layer and the p-cladding/current spreading region, the p-SCH being substantially optically absorbing at the wavelength range emitted by the active layer.

2. The device of claim 1, wherein the active layer comprises a light emitting layer of a double heterostructure or a quantum well.

3. The device of claim 1, wherein a majority of the p-cladding/current spreading region is substantially optically absorbing at the wavelength range emitted by the active layer.

4. The device of claim 1, wherein turn on and operating voltages for the device are less than turn on and operating voltages for a substantially similar device that includes a p-SCH which is substantially optically transmissive at the wavelength range emitted by the active layer.

5. The device of claim 1, wherein the active layer comprises AlGaN and the wavelength range has a peak value less than about 300 nm.

6. The device of claim 5, wherein the p-SCH comprises AlGaN and an Al concentration of the p-SCH is less than an Al concentration of the active layer.

7. The device of claim 1, wherein:
   the active layer comprises $Al_xGa_{1-x}N$;
   the p-SCH comprises $Al_yGa_{1-y}N$, where y<x; and
   the p-cladding/current spreading region comprises a first surface near the p-SCH and a second surface near the p-contact and the p-cladding/current spreading region has a composition of $Al_zGa_{1-z}N$ that varies from $z_1$ at the first surface to $z_2$ at the second surface, where $z_1 > z_2$.

8. The device of claim 7, wherein the p-cladding/current spreading region comprises a superlattice that includes a number of layer pairs and at least some of the layer pairs have an Al content that is less than an Al content of the active layer.

9. The device of claim 8, wherein the second surface is comprised of GaN.

10. The device of claim 8, wherein each of the layer pairs comprises a first layer and a second layer, and wherein an Al content of one or both of the first and second layers in the layer pairs is a function of position of the layer pair in the superlattice.

11. The device of claim 8, wherein each of the layer pairs comprises a first layer and a second layer, and wherein thickness of the first and second layers in the layer pairs is a function of position of the layer pair in the superlattice with respect to the active layer.

12. A light emitting diode, comprising
   an active layer comprising $Al_xGa_{1-x}N$;
   a p-contact;
   a p-cladding/current spreading region disposed between the p-contact and the active layer; and
   a p-side separate confinement heterostructure (p-SCH) comprising $Al_yGa_{1-y}N$ disposed between the active layer and the p-cladding/current spreading region, the p-SCH having a lower Al content than an Al content of the active layer, wherein a turn on voltage or operating voltage of the diode is less than a substantially similar light emitting diode except that a p-SCH of the substantially similar diode has an Al content that is greater than or equal to an Al content of an active layer.

13. The device of claim 12, wherein the active layer of the diode generates light in a wavelength range having a peak wavelength of less than about 300 nm.

14. A light emitting device, comprising:
   a p-side, comprising:
      a p-side contact;
      an electron blocking layer;
      a p-side separate confinement heterostructure (p-SCH); and
      a p-cladding/current spreading region disposed between the p-SCH and the p-side contact;
   an n-side comprising:
      an n-side contact; and
      an n-side separate confinement heterostructure (n-SCH); and
   an active layer disposed between the p-side and the n-side, the active layer configured to emit light in a wavelength range, wherein the p-side and the n-side have asymmetrical optical transmission properties with respect to the wavelength range emitted by the active layer.

15. The device of claim 14, wherein the n-SCH is substantially optically transmissive at the wavelength range emitted by the active layer and the p-SCH is substantially optically absorbing at the wavelength range emitted by the active layer.

16. The device of claim 14, wherein a bandgap of the n-SCH is greater than a bandgap of the p-SCH.

17. The device of claim 14, wherein an Al content of the n-SCH is greater than an Al content of the p-SCH.

18. The device of claim 14, wherein the wavelength range has a peak wavelength less than about 300 nm.

* * * * *